United States Patent [19]

Berg

[11] Patent Number: 4,570,889
[45] Date of Patent: Feb. 18, 1986

[54] BEARING BRACKET FOR MOUNTING A BEARING SHAFT TO A MOUNTING STRIP

[75] Inventor: Franco Berg, Isernhagen, Fed. Rep. of Germany

[73] Assignee: Rittal-Werk Rudolf Loh GmbH & Co. KG, Herborn, Fed. Rep. of Germany

[21] Appl. No.: 670,625

[22] Filed: Nov. 13, 1984

[30] Foreign Application Priority Data

Nov. 15, 1983 [DE] Fed. Rep. of Germany ... 8332758[U]

[51] Int. Cl.⁴ .............................................. E04G 3/00
[52] U.S. Cl. .................................. 248/220.2; 248/534
[58] Field of Search .............. 248/220.2, 220.3, 222.1, 248/222.2, 222.3, 523, 519, 534

[56] References Cited

U.S. PATENT DOCUMENTS 4,450,655 5/1984 Rosenthal et al. ............... 248/222.3
4,500,943 2/1985 Greene ............................ 248/222.2

Primary Examiner—Ramon S. Britts
Assistant Examiner—Ramon O. Ramirez
Attorney, Agent, or Firm—Thomas W. Speckman

[57] ABSTRACT

A bearing bracket for mounting a shaft to a mounting strip having a row of holes, particularly to a mounting strip fastened parallel to and from a control board panel, in which the end of a shaft is inserted and retained in a bore in the bearing bracket, a seating area extends parallel to the bore and has centering pins for locking onto the mounting strip, and a pivoting locking lever with a tensioning eccentric is arranged opposite the seating area and upon rotation the mounting strip against the seating area to provide fastening and loosening of the bearing bracket in a single, simple operation.

20 Claims, 5 Drawing Figures

BEARING BRACKET FOR MOUNTING A BEARING SHAFT TO A MOUNTING STRIP

BACKGROUND OF THE INVENTION

1. Field of the Invention

This invention relates to a device for mounting a bearing shaft, a bearing bolt or the like, to a mounting strip having a row of holes, particularly to a mounting strip fastened parallel to and at a distance from a control board panel.

2. Description of the Prior Art

A prior mounting device has been used to fasten the shaft bearing of a hinged working table to the mounting strip of a control board, as shown in German Utility Model DE-GM No. 83 10 783. The bearing elements used for this purpose, which are screwed into the mounting strip of the shaft bearing, are adequate if the shaft bearing always remains at the same place on the mounting strip. However, if it is desirable to be able to loosen the bearing elements of the shaft bearing quickly and easily, and then to re-fasten them in a different position on the mounting strip or on a different mounting strip, the known bearing elements are not suitable since both loosening and re-fastening require considerable effort.

An object of this invention is to provide a device of the type described above which allows quick and easy attachment of the end of a bearing bolt or a bearing shaft to a mounting strip having a row of holes.

SUMMARY OF THE INVENTION

According to this invention, this objective is attained as follows: the end of the bearing bolt or the bearing shaft is inserted into the bore of a bearing bracket, the bearing bracket has a seating area which extends parallel to the bore and has centering pins for locking onto the mounting strip and a pivoting locking lever is arranged opposite the seating area on a flange of the bearing bracket to force the mounting strip against the seating area of the bearing bracket by means of a tensioning eccentric.

The seating area of the bearing bracket may be forced against a desired portion of the mounting strip, yet the centering pins allow variable placement along the mounting strip, determined by the arrangement of holes in a row of holes on the mounting strip. The locking lever need only be rotated to the locked position to cause the tensioning eccentric to force the seating area of the bearing bracket against the mounting strip. The locking lever may be unlocked to release the bearing bracket from its mounted position. Fastening and loosening of the bearing bracket thus requires a single, simple operation.

When the mounting strip is L-shaped or Z-shaped and firmly connected to the control board panel, one embodiment provides that the thickness of the bearing bracket is less than the distance between the mounting strip and the control board panel, so that the bearing bracket can be inserted between the control board panel and the mounting strip, and the locking lever is easily accessible and can be operated from the front.

The bearing bracket can be attached undetachably at the end of the bearing shaft by simply providing an eye ring at the end of the bearing shaft and by inserting a pin into the bearing bracket in a cross bore which runs perpendicular to the bore hole for the bearing shaft, and intersects it; this pin engages the eye ring of the attached bearing shaft. The pin secures the bearing bracket so it cannot slide along the axis of the bearing shaft, but the shaft can still be rotated in the bore of the bearing bracket.

The pivot mechanism of the locking lever with its tensioning eccentric has been designed so that the locking lever, together with the tensioning eccentric, pivots on a hollow pin which extends from the flange, and is held on the hollow pin by a fastening bolt inserted in the hollow pin.

According to another embodiment, the receptacle for the hollow pin in the tensioning eccentric of the bearing bracket has a notch pointing toward the end of the locking lever, so the locking lever mounted on the hollow pin can be kept under tension and it remains fixed in the position in which it has been set.

The arrangement of the flange on the bearing bracket has been designed so that the flange is flush with the wall of the bearing bracket that has the bore; on one side of that wall there is a collar around the bore, and the hollow pin is arranged on the opposite side of the flange. This arrangement allows the bearing bracket to be relatively small and yet to provide a sufficiently large seating area for the mounting strip if the seating area of the bearing bracket is adjacent to the flange and the seating area has at least two centering pins that match the arrangement and the dimension of holes in a row of holes on the mounting strip, the centering pins arranged on a line parallel to the flange. The seating area of the bearing bracket and the tensioning eccentric preferably have the same width.

Attachment of the bearing bracket to the mounting strip is facilitated, by the present invention, in that the tensioning eccentric is flattened on the side facing away from the locking lever; the flattened side of the tensioning eccentric is parallel to the seating area of the bearing bracket and at a distance from the centering pins that is larger than the thickness of the mounting strip.

Another mounting arrangement for the bearing bracket is possible according to an embodiment in which the bearing bracket has blind end mounting bores, originating on the opposite side of the seating area and aligned with the centering pins. Since the locking lever with the tensioning eccentric is not needed in this embodiment, the bearing bracket may be covered on this side with a cover; the rim of the cover having a portal-like section to cover the portal-like flange and the side of the bearing bracket, while the straight section covers the side of the bearing bracket with the mounting bores, the cover having holes that coincide with the mounting bores of the bearing bracket.

BRIEF DESCRIPTION OF THE DRAWINGS

The invention will be explained in greater detail with reference to the accompanying drawings in which.

DESCRIPTION OF THE PREFERRED EMBODIMENTS

Figure 2:
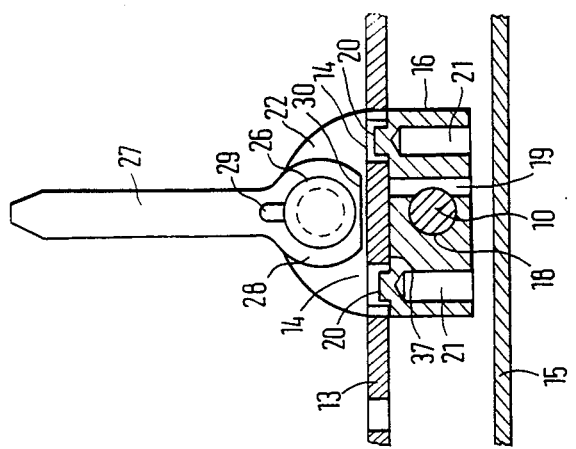
FIG. 2 shows a front view, partially in cross section, of the mounting area of FIG. 1.
Figure 1:
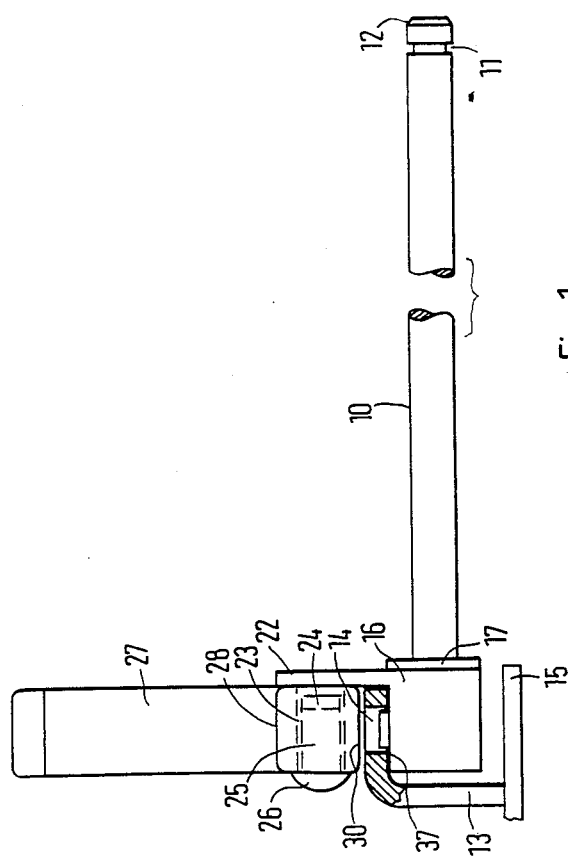
FIG. 1 shows a side view, partially in cross section, of a bearing shaft attached to a mounting strip by means of a bearing bracket with a locking lever.
Figure 3:
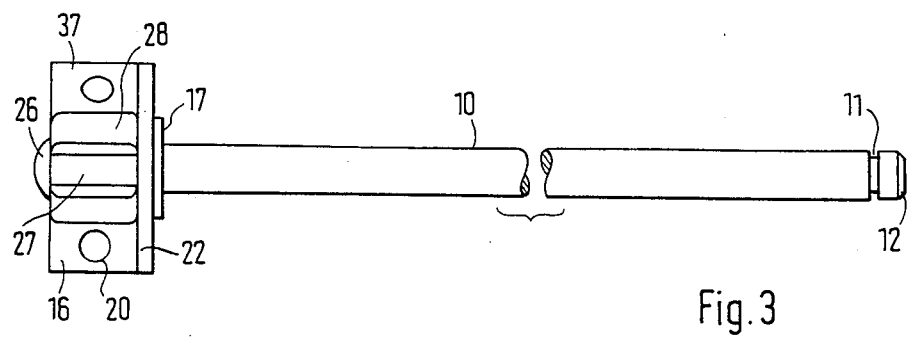
FIG. 3 shows a top view of the mounting area of FIG. 1.

In the embodiment of this invention shown in FIGS. 1-3, both ends of shaft 10 may be attached to a mounting strip. Each end of shaft 10 may be provided with insertion bevel 12 and eye ring 11, as shown in FIG. 1. One end of shaft 10 may be inserted into bore 18 of bearing bracket block 16. A pin is inserted into cross bore 19 which intersects bore 18; this pin engages eye ring 11 and so fixes bearing bracket 16 on this axis, yet the bearing bracket remains rotatable with respect to shaft 10. Bearing bracket 16 is mounted on the shaft bearing so that the side with collar 17 around bore 18 faces shaft 10. Collar 17 prevents other parts attached to shaft 10 from contacting bearing bracket 16 along a large part of its surface. On the side of the bearing bracket having collar 17, flange 22 is flush with bearing bracket 16. On its opposite side, flange 22 forms a right angle with the surface of bearing bracket 16 to form seating area 37 adjacent to the flange. Seating area 37 has at least two centering pins 20 that match the arrangement and dimension of holes comprising the row of holes 14 on mounting strip 13. This allows bearing bracket 16 to be attached to the mounting strip at various locations determined by the arrangement of holes on mounting strip 13. This is done by inserting centering pins 20 into holes comprising the row of holes 14.

Hollow pin 23 with its interior receptacle 24 extends from the side of flange 22 adjacent seating area 37. Locking lever 27 with tensioning eccentric 28 pivots on hollow pin 23. As shown in FIG. 1, tensioning eccentric 28 has the same width as seating area 37. Tensioning eccentric 28 has a receptacle that accommodates hollow pin 23. Fastening bolt 25 is inserted into receptacle 24 of hollow pin 23 and the head 26 of fastening bolt 25 holds tensioning eccentric 28 in place on hollow pin 23. The receptacle in tensioning eccentric 28 may have notch 29 that points toward locking lever 27. This notch serves to keep tensioning eccentric 28 under tension on hollow pin 23, so that locking lever 27 is retained in the desired position.

Tensioning eccentric 28 has flattened portion 30 on its side opposite locking lever 27, which extends parallel to seating area 37 of bearing bracket 16 in the position of the locking lever 27 shown in FIG. 2; its distance from centering pins 20 is larger than the thickness of mounting strip 13. In this position, mounting strip 13 can be inserted in the space between seating area 37 and flattened portion 30 of tensioning eccentric 28. The height of centering pins 20 may be relatively small since they need protrude only partially into holes comprising the row of holes 14 in order to be fastened onto mounting strip 13.

When locking lever 27 is turned from its perpendicular position, tensioning eccentric 28 forces mounting strip 13 against seating area 37 on bearing bracket 16. The shape of the tensioning eccentric is designed so that tensioning eccentric 28 automatically locks onto mounting strip 13.

Mounting strip 13, which can be L-shaped or Z-shaped, is attached to control board panel 15 in such a way that the row of holes 14 is parallel and at a distance from control board panel 15. In order to make it easy to slide bearing bracket 16 onto mounting strip 13, the thickness of bearing bracket 16 is designed to be smaller than the distance between mounting strip 13 and control board panel 15.

Figure 4:
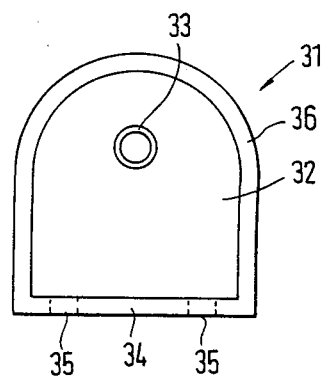
FIG. 4 shows a cover for covering the bearing bracket.
Figure 5:
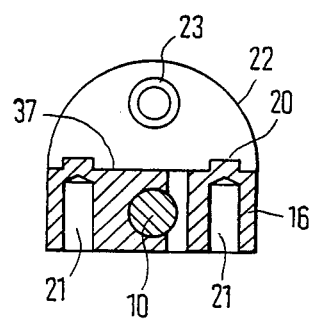
FIG. 5 shows a front view, partially in cross section, of a bearing bracket without a locking lever attached to a bearing shaft.

The end of bearing bracket 16 opposite seating area 37 may additionally have mounting bores 21, which can be blind end bores or blind end tapholes. Mounting holes 21 facilitate the direct mounting of bearing bracket 16 to control board panel 15. Since in this embodiment, locking lever 27 with tensioning eccentric 28 is not needed, bearing bracket 16 may be covered by cover 31, as shown in FIG. 4, when locking lever 27 is removed, as shown in FIG. 5. Cover 31 has a portal-like section 36, and flat section 34, to cover bearing bracket 16 and portal-like flange 22 in such a way that the side of the bearing bracket with collar 17 is flush with the edges of cover 31. Hollow pin 23 has inside receptacle 24 for mounting pin 33 that extends inside end plate 32 of cover 31. Flat section 34 of cover 31 has holes 35 that coincide with the mounting bores 21 of bearing bracket 16. Bearing bracket 16 and cover 31 may be fastened to control board panel 15 as one piece by inserting mounting screws through holes 35 and screwing them into bores 21. Cover 31 covers seating area 37 and hollow pin 23 of bearing bracket 16 to form an enclosed bearing element.

I claim:

1. A bearing bracket for fastening a shaft (10) to a mounting strip (13) of a control panel (15) having a row of holes (14), said bearing bracket comprising a bearing block (16) having bore (18) for receipt of one end of said shaft (10), a seating area (37) parallel to said bore (18) and having centering pins (20) extending therefrom arranged for insertion into said holes (14) of said mounting strip (13), a flange (22) extending perpendicularly from said seating area (37), and a pivot means (23) extending perpendicularly from said flange (22) spaced from said seating area (37), a locking lever (27) pivotally attached to said pivot means and including a tensioning eccentric (28) thereon which forces said mounting strip (13) against said seating area (37) of said bearing bracket (16).

2. A bearing bracket according to claim 1, wherein the thickness of said bearing block (16) is less than the distance between said mounting strip (13) and said control panel (15).

3. A bearing bracket according to claim 2, wherein said shaft (10) has eye ring (11) disposed near its end and said bearing bracket (16) has cross bore (19) at right angles to and intersecting said bore (18) to receive a pin which engages eye ring (11) on said shaft (10).

4. A bearing bracket according to claim 3, wherein said locking lever (27) and said tensioning eccentric (28) pivot on hollow pin (23) extending from said flange (22) and are retained on said hollow pin (23) by head (26) of mounting bolt (25) which is retained in hollow pin (23).

5. A bearing bracket according to claim 4 wherein a receptacle in said tensioning eccentric (28) for said hollow pin (23) of said bearing bracket (16) has notch (29) that extends toward said locking lever (27).

6. A bearing bracket according to claim 5, wherein said flange (22) is flush with the side of said bearing block (16) having said bore (18) and bearing block (16) has collar (17) around said bore (18) on this side, and that said hollow pin (23) extends from the opposite side of said flange (22).

7. A bearing bracket according to claim 6, wherein said seating area (37) of said bearing bracket (16) is adjacent to said flange (22) and has at least two said centering pins (20) that match the arrangement and dimensions of holes comprising said row of holes (14)

on said mounting strip (13), said centering pins arranged on a line parallel with said flange (22).

8. A bearing bracket according to claim 7, wherein said seating area (37) of said bearing bracket (16) is the same width as said tensioning eccentric (28).

9. A bearing bracket according to claim 8 in combination with said tensioning eccentric (28) having a flattened portion (30) on its side opposite said locking lever (27) and parallel to said seating area (37) of said bearing bracket (16), the distance of said flattened portion (30) from centering pin (20) is larger than the thickness of said mounting strip (13).

10. A bearing bracket according to claim 9, wherein said bearing bracket (16) has blind end bores (21) originating on the opposite side from said seating area (37) and extending toward said centering pins (20).

11. A bearing bracket according to claim 1, wherein said shaft (10) has eye ring (11) disposed near its end and said bearing bracket (16) has cross bore (19) at right angles to and intersecting said bore (18) to receive a pin which engages eye ring (11) on said shaft (10).

12. A bearing bracket according to claim 1, wherein said locking lever (27) and said tensioning eccentric (28) pivot on hollow pin (23) extending from said flange (22) and are retained on said hollow pin (23) by head (26) of mounting bolt (25) which is retained in hollow pin (23).

13. A bearing bracket according to claim 1, wherein a receptacle in said tensioning eccentric (28) for said hollow pin (23) of said bearing bracket (16) has notch (29) that extends toward said locking lever (27).

14. A bearing bracket according to claim 1, wherein said flange (22) is flush with the side of said bearing block (16) having said bore (18) and bearing block (16) has collar (17) around said bore (18) on this side, and that said hollow pin (23) extends from the opposite side of said flange (22).

15. A bearing bracket according to claim 1, wherein said seating area (37) of said bearing bracket (16) is adjacent to said flange (22) and has at least two said centering pins (20) that match the arrangement and dimensions of holes comprising said row of holes (14) on said mounting strip (13), said centering pins arranged on a line parallel with said flange (22).

16. A bearing bracket according to claim 1, wherein said seating area (37) of said bearing bracket (16) is the same width as said tensioning eccentric (28).

17. A bearing bracket according to claim 1 in combination with said tensioning eccentric (28) having a flattened portion (30) on its side opposite said locking lever (27) and parallel to said seating area (37) of said bearing bracket (16), the distance of said flattened portion (30) from centering pin (20) is larger than the thickness of said mounting strip (13).

18. A bearing bracket according to claim 1, wherein said bearing bracket (16) has blind end bores (21) originating on the opposite side from said seating area (37) and extending toward said centering pins (20).

19. A bearing bracket according to claim 18 in combination with a cover (31), said cover (31) comprising curved wall (36), flat wall (34) joining end legs of said curved wall (36), and end plate (32), said end plate (32) having a through hole aligned with said pivot means (23), and said flat wall (34) has holes (35) aligned with said blind end bores (21).

20. A bearing bracket and cover of claim 19 additionally having mounting pin (33) extending through said through hole in said end plate (32) and fastened within said pivot means (23).

* * * * *